(12) United States Patent
Chen et al.

(10) Patent No.: US 10,002,843 B2
(45) Date of Patent: Jun. 19, 2018

(54) SEMICONDUCTOR SUBSTRATE STRUCTURE, SEMICONDUCTOR PACKAGE AND METHOD OF MANUFACTURING THE SAME

(71) Applicant: Advanced Semiconductor Engineering, Inc., Kaosiung (TW)

(72) Inventors: Tien-Szu Chen, Kaohsiung (TW); Kuang-Hsiung Chen, Kaohsiung (TW); Sheng-Ming Wang, Kaohsiung (TW); Yu-Ying Lee, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days. days.

(21) Appl. No.: 14/667,317

(22) Filed: Mar. 24, 2015

(65) Prior Publication Data
US 2016/0284659 A1    Sep. 29, 2016

(51) Int. Cl.
*H01L 23/48*     (2006.01)
*H01L 23/498*    (2006.01)
*H01L 23/52*     (2006.01)
*H01L 23/31*     (2006.01)
(Continued)

(52) U.S. Cl.
CPC .......... *H01L 24/17* (2013.01); *H01L 23/3157* (2013.01); *H01L 24/48* (2013.01);
(Continued)

(58) Field of Classification Search
CPC . H01L 2224/13005; H01L 2224/16225; H01L 2224/73204
See application file for complete search history.

(56) References Cited

U.S. PATENT DOCUMENTS 7,705,245 B2   4/2010   Miyamoto et al.
7,880,091 B2   2/2011   Miyamoto et al.
(Continued)

FOREIGN PATENT DOCUMENTS

CN   103066051 A   4/2013
CN   204632752 U   9/2015
(Continued)

OTHER PUBLICATIONS

Search Report for corresponding Taiwan Patent Application No. 104109877, dated Oct. 18, 2016, 1 page.
(Continued)

*Primary Examiner* — Raj R Gupta
(74) *Attorney, Agent, or Firm* — Foley & Lardner LLP; Cliff Z. Liu

(57) ABSTRACT

The present disclosure relates to a semiconductor substrate structure, semiconductor package and method of manufacturing the same. The semiconductor substrate structure includes a conductive structure and a dielectric structure. The conductive structure has a first conductive surface and a second conductive surface opposite to the first conductive surface. The dielectric structure covers at least a portion of the conductive structure, and has a first dielectric surface and a second dielectric surface opposite to the first dielectric surface. The first conductive surface does not protrude from the first dielectric surface, and the second conductive surface is recessed from the second dielectric surface. The dielectric structure includes, or is formed from, a photo-sensitive resin, and the dielectric structure defines a dielectric opening in the second dielectric surface to expose a portion of the second conductive surface.

20 Claims, 18 Drawing Sheets

(51) Int. Cl.
*H05K 3/20* (2006.01)
*H01L 23/00* (2006.01)
*H05K 1/11* (2006.01)
*H05K 3/10* (2006.01)

(52) U.S. Cl.
CPC .............. *H01L 24/49* (2013.01); *H05K 1/111* (2013.01); *H05K 3/10* (2013.01); *H01L 23/3128* (2013.01); *H01L 2224/16225* (2013.01); *H01L 2224/16258* (2013.01); *H01L 2224/17106* (2013.01); *H01L 2224/32225* (2013.01); *H01L 2224/48091* (2013.01); *H01L 2224/48101* (2013.01); *H01L 2224/48227* (2013.01); *H01L 2224/48228* (2013.01); *H01L 2224/48245* (2013.01); *H01L 2224/49433* (2013.01); *H01L 2224/73265* (2013.01); *H01L 2924/00014* (2013.01); *H01L 2924/0665* (2013.01); *H01L 2924/1511* (2013.01); *H01L 2924/1517* (2013.01); *H01L 2924/1579* (2013.01); *H01L 2924/15311* (2013.01); *H01L 2924/15331* (2013.01); *H01L 2924/181* (2013.01)

(56) References Cited

U.S. PATENT DOCUMENTS

| | | | |
|---|---|---|---|
| 7,939,935 B2 | 5/2011 | Chinda et al. | |
| 8,101,864 B2 | 1/2012 | Chinda et al. | |
| 8,230,591 B2 | 7/2012 | Chinda et al. | |
| 2004/0110319 A1* | 6/2004 | Fukutomi | H01L 21/4803 438/106 |
| 2008/0017995 A1* | 1/2008 | Karashima | H01L 24/81 257/778 |
| 2010/0171205 A1* | 7/2010 | Chen | H01L 21/565 257/686 |
| 2013/0113099 A1 | 5/2013 | Lim et al. | |
| 2015/0092357 A1* | 4/2015 | Yoshikawa | H01L 25/00 361/746 |
| 2016/0284659 A1 | 9/2016 | Chen et al. | |

FOREIGN PATENT DOCUMENTS

| | | |
|---|---|---|
| JP | H06-302938 A | 10/1994 |
| JP | 2003-133711 A | 5/2003 |
| TW | 201248748 A | 12/2012 |
| TW | M512215 U | 11/2015 |

OTHER PUBLICATIONS

Office Action for corresponding Chinese Patent Application No. 201510196538.9, dated Mar. 29, 2018, 12 pages.

Search Report for corresponding Chinese Patent Application No. 201510196538.9, issued with Office Action dated Mar. 29, 2018, 6 pages.

* cited by examiner

SEMICONDUCTOR SUBSTRATE STRUCTURE, SEMICONDUCTOR PACKAGE AND METHOD OF MANUFACTURING THE SAME

BACKGROUND

1. Technical Field

The present disclosure relates to a semiconductor substrate structure, semiconductor package and method of manufacturing the same, and, more particularly, to a semiconductor substrate structure including a photo-sensitive resin, a semiconductor package including the same and method of manufacturing the same.

2. Description of the Related Art

Design trends in the semiconductor industry include weight reduction and miniaturization of semiconductor products. However, techniques for weight reduction and miniaturization may result in manufacturing problems. For example, a thin semiconductor substrate with one layer of embedded conductive traces can result in low yield during manufacturing, as a thin semiconductor substrate structure can be difficult to handle.

Therefore, it is desirable to provide an improved semiconductor substrate structure, semiconductor package and method of manufacturing the same.

SUMMARY

One aspect of the present disclosure relates to a semiconductor substrate structure. In one embodiment, the semiconductor substrate structure comprises a conductive structure and a dielectric structure. The conductive structure has a first conductive surface and a second conductive surface opposite to the first conductive surface. The dielectric structure covers at least a portion of the conductive structure, and has a first dielectric surface and a second dielectric surface opposite to the first dielectric surface. The first conductive surface does not protrude from the first dielectric surface, and the second conductive surface is recessed from the second dielectric surface. The dielectric structure includes, or is formed from, a cured photo-sensitive resin, and the dielectric structure defines a dielectric opening in the second dielectric surface to expose a portion of the second conductive surface.

Another aspect of the present disclosure relates to a semiconductor package. In one embodiment, the semiconductor package comprises a semiconductor substrate structure, a semiconductor die and an encapsulant. The semiconductor substrate structure comprises a conductive structure and a dielectric structure. The conductive structure has a first conductive surface and a second conductive surface opposite to the first conductive surface. The dielectric structure covers at least a portion of the conductive structure, and has a first dielectric surface and a second dielectric surface opposite to the first dielectric surface. The first conductive surface does not protrude from the first dielectric surface, and the second conductive surface is recessed from the second dielectric surface. The dielectric structure includes, or is formed from, a cured photo-sensitive resin, and the dielectric structure defines a dielectric opening in the second dielectric surface to expose a portion of the second conductive surface. The semiconductor die is electrically connected to the first conductive surface. The encapsulant covers the semiconductor die and a portion of the semiconductor substrate structure.

Another aspect of the present disclosure relates to a method for manufacturing a semiconductor substrate structure. In one embodiment, the method comprises: (a) providing a first carrier; (b) forming a conductive structure on the first carrier, wherein the conductive structure has a first conductive surface and a second conductive surface opposite to the first conductive surface, and the first conductive surface is disposed on the first carrier; (c) forming a dielectric structure to cover the conductive structure, wherein the dielectric structure has a first dielectric surface and a second dielectric surface opposite to the first dielectric surface, the dielectric structure includes a photo-sensitive resin, and the first conductive surface is substantially coplanar with the first dielectric surface; (d) forming a dielectric opening in the second dielectric surface of the dielectric structure to expose a portion of the second conductive surface; (e) removing the first carrier, wherein the first conductive surface is exposed from the first dielectric surface; and (f) providing a second carrier on the second dielectric surface.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are specified with respect to a certain element or certain plane of an element, as described in the specification and shown in the figures. Furthermore, it should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
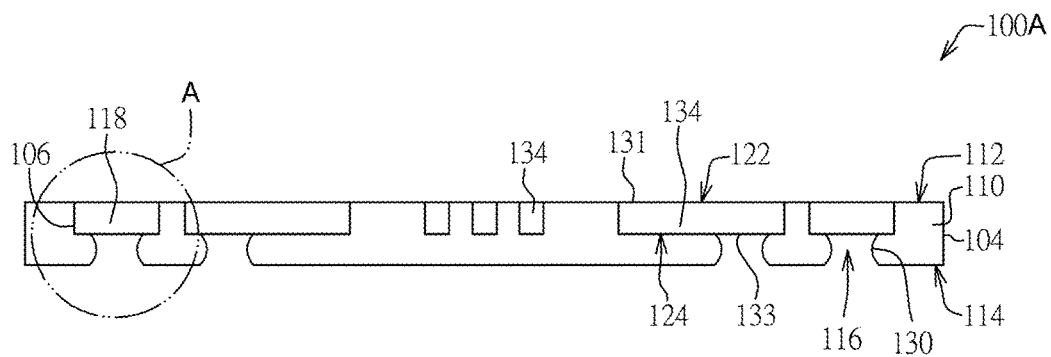
FIG. 1 illustrates a cross-sectional view of a semiconductor substrate structure according to an embodiment of the present disclosure.

FIG. 1 illustrates a cross-sectional view of a semiconductor substrate structure 100A according to an embodiment of the present disclosure. The thickness of the semiconductor substrate structure 100A may be in a range from about 20 micrometers (μm) to about 60 μm; for example, in a range of about 20 μm to about 50 μm, in a range of about 20 μm to about 40 μm, or in a range of about 20 μm to about 30 μm. The semiconductor substrate structure 100A includes a dielectric structure 104 and one or more conductive structures 106. In this embodiment, the dielectric structure 104 is a dielectric layer 110, and has a first dielectric surface 112, a second dielectric surface 114 opposite to the first dielectric surface 112, and one or more dielectric openings 116 in the second dielectric surface 114. The material of the dielectric layer 110 includes, or is formed from, a cured photosensitive resin that has an interpenetrating polymer network (IPN) structure. The photo-sensitive resin includes a base resin (e.g., acrylic resin or epoxy resin) and a photo-initiator. In some embodiments, the photo-sensitive resin is CA-40 AUS320 from Taiyo Ink Mfg. Co., Ltd.

In this embodiment, the conductive structure 106 is a single-layered metal layer structure, and comprises a first patterned conductive layer 118. The first patterned conductive layer 118 comprises one or more bonding pads 131 (e.g., bump pad for flip chip bonding or finger pad for wire bonding), one or more ball pads 133 and first conductive traces 134. The first patterned conductive layer 118 has a first conductive surface 122 and a second conductive surface 124 opposite to the first conductive surface 122. The dielectric structure 104 (the dielectric layer 110) covers at least a portion of the conductive structure 106 (the first patterned conductive layer 118). The first conductive surface 122 does not protrude from the first dielectric surface 112, meaning that portions of, or all of, the first conductive surface 122 may be substantially coplanar with the first dielectric surface 112, or recessed from the first dielectric surface 112. The second conductive surface 124 is recessed from the second dielectric surface 114. The dielectric openings 116 expose portions of the second conductive surface 124. The ball pads 133 are exposed portions of the second conductive surface 124.

As illustrated for the embodiment of FIG. 1, the first conductive surface 122 is substantially coplanar with the first dielectric surface 112 of the dielectric layer 110. The bonding pads 131 (e.g., bump pad or finger pad) each have an upper surface along the first conductive surface 122 and a lower surface along the second conductive surface 124. The upper surface of each of the bonding pads 131 is exposed from the first dielectric surface 112, and the lower surface of each of the bonding pads 131 is covered by the dielectric structure 104 (dielectric layer 110). The ball pads 133 each have an upper surface along the first conductive surface 122 and a lower surface along the second conductive surface 124. The upper surface of each of the ball pads 133 is exposed from the first dielectric surface 112, and the lower surface of each of the ball pads 133 is exposed in the dielectric openings 116. As illustrated, a first conductive trace 134 connects a bonding pad 131 and a ball pad 133. In this embodiment, the first conductive traces 134 may be fine pitch, such as a pitch between trace centers of less than or equal to about 15 μm, or less than or equal to about 10 μm.

Figure 1A:
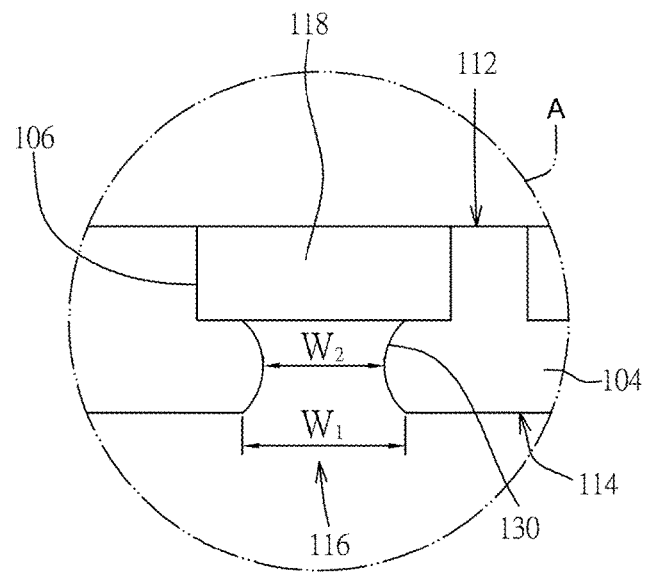
FIG. 1A illustrates a partially enlarged view of the area A of the semiconductor substrate structure of FIG. 1.

FIG. 1A illustrates a partially enlarged view of the area A of the semiconductor substrate structure 100A of FIG. 1. A side wall 130 defining the dielectric opening 116 is curved. That is, the dielectric opening 116 has a first width $W_1$ at the second dielectric surface 114 and a second width $W_2$ at a middle portion of the dielectric opening 116, and the first width $W_1$ is greater than the second width $W_2$. For example, a difference between the first width $W_1$ and the second width $W_2$ may be at least about 2 μm, such as at least about 3 μm, at least about 4 μm, at least about 5 μm, or at least about 10 μm. As another example, a ratio of the first width $W_1$ to the second width $W_2$ may be at least about 1.05, at least about 1.1, at least about 1.2, at least about 1.3, at least about 1.4, at least about 1.5, or at least about 2. An example of formation of a curved side wall 130 is described with respect to FIG. 16H.

Figure 2:
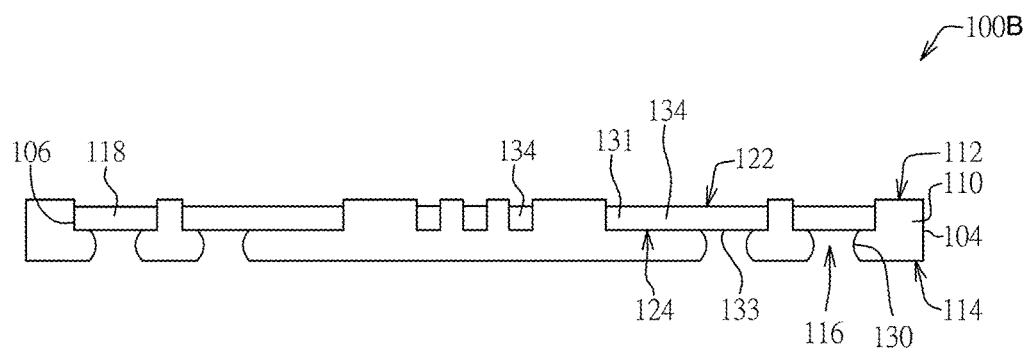
FIG. 2 illustrates a cross-sectional view of a semiconductor substrate structure according to another embodiment of the present disclosure.

FIG. 2 illustrates a cross-sectional view of a semiconductor substrate structure 100B according to another embodiment of the present disclosure. The semiconductor substrate structure 100B of this embodiment is similar to the semiconductor substrate structure 100A illustrated in FIG. 1, except that the first conductive surface 122 of the embodiment of FIG. 2 is recessed from the first dielectric surface 112. In other embodiments, portions of the first conductive surface 122 are recessed from the first dielectric surface 112, while other portions of the first conductive surface 122 are substantially coplanar with the first dielectric surface 112.

Figure 3:
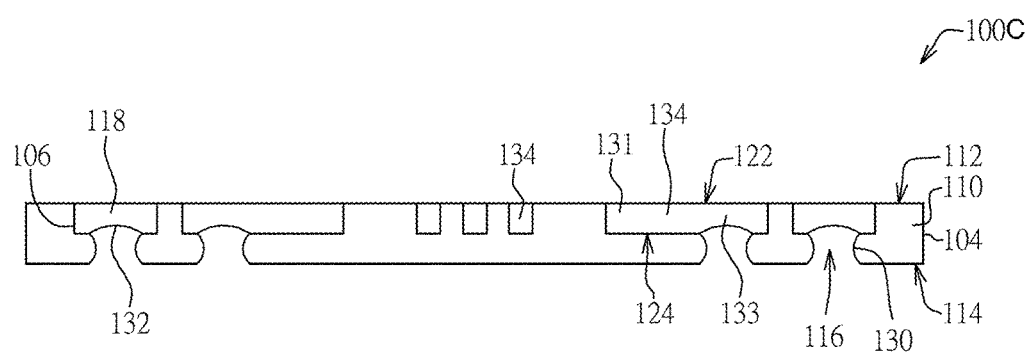
FIG. 3 illustrates a cross-sectional view of a semiconductor substrate structure according to another embodiment of the present disclosure.

FIG. 3 illustrates a cross-sectional view of a semiconductor substrate structure 100C according to another embodiment of the present disclosure. The semiconductor substrate structure 100C of this embodiment is similar to the semiconductor substrate structure 100A illustrated in FIG. 1, except that each of the ball pads 133 include a recessed portion 132 on the lower surface of the ball pad 133 exposed in the dielectric opening 116. An example of formation of a recess portion 132 is described with respect to FIG. 16H.

Figure 4:
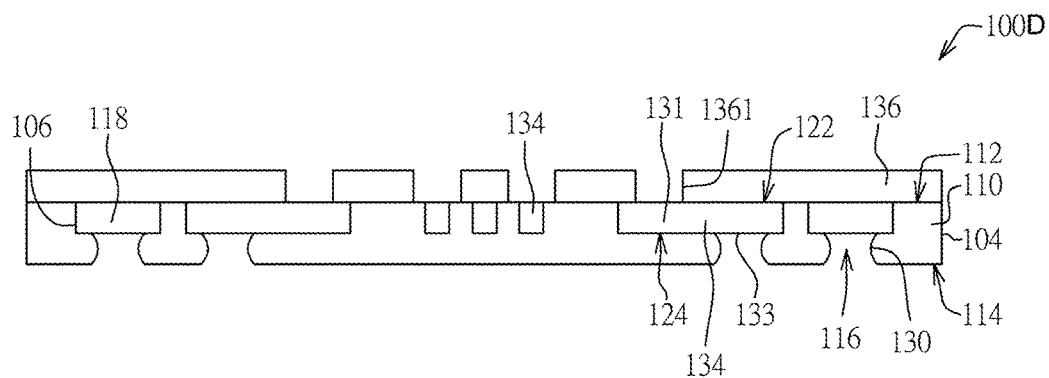
FIG. 4 illustrates a cross-sectional view of a semiconductor substrate structure according to another embodiment of the present disclosure.

FIG. 4 illustrates a cross-sectional view of a semiconductor substrate structure 100D according to another embodiment of the present disclosure. The semiconductor substrate structure 100D of this embodiment is similar to the semiconductor substrate structure 100A illustrated in FIG. 1, except that a solder resist layer 136 is disposed on the first conductive surface 122 and the first dielectric surface 112. The solder resist layer 136 includes a plurality of openings 1361 to expose one or more first conductive traces 134 and one or more bonding pads 131. The material of the solder resist layer 136 may be the same as, or different from, the material of the dielectric layer 110. Generally, the material of the solder resist layer 136 may be, for example, one of, or a combination of, pre-preg, Ajinomoto build-up film (ABF), photoresist, liquid crystal polymer (LCP), polyimide (PI) or photo-sensitive resin.

Figure 5:
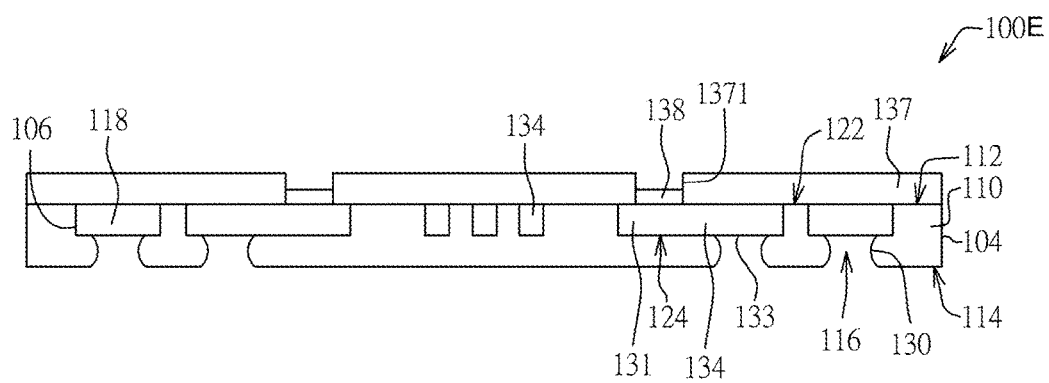
FIG. 5 illustrates a cross-sectional view of a semiconductor substrate structure according to another embodiment of the present disclosure.

FIG. 5 illustrates a cross-sectional view of a semiconductor substrate structure 100E according to another embodiment of the present disclosure. The semiconductor substrate structure 100E of this embodiment is similar to the semiconductor substrate structure 100A illustrated in FIG. 1, except that the semiconductor substrate structure 100E further comprises a solder resist layer 137 and one or more surface finish layers 138. The solder resist layer 137 is disposed on the first conductive surface 122 and the first dielectric surface 112, and includes a plurality of openings 1371 to expose the bonding pads 131 (finger pads). The material of the solder resist layer 137 may be the same as, or different from, the material of the dielectric layer 110. Generally, the material of the solder resist layer 137 may be, for example, one of, or a combination of, pre-preg, Ajinomoto build-up film (ABF), photoresist, liquid crystal polymer (LCP), polyimide (PI) or photo-sensitive resin. The surface finish layer 138 is disposed in the openings 1371 on the exposed bonding pads 131. The surface finish layer 138 may be formed of one or more individual layers, each of which may be, for example, nickel, gold, silver or an alloy thereof.

Figure 6:
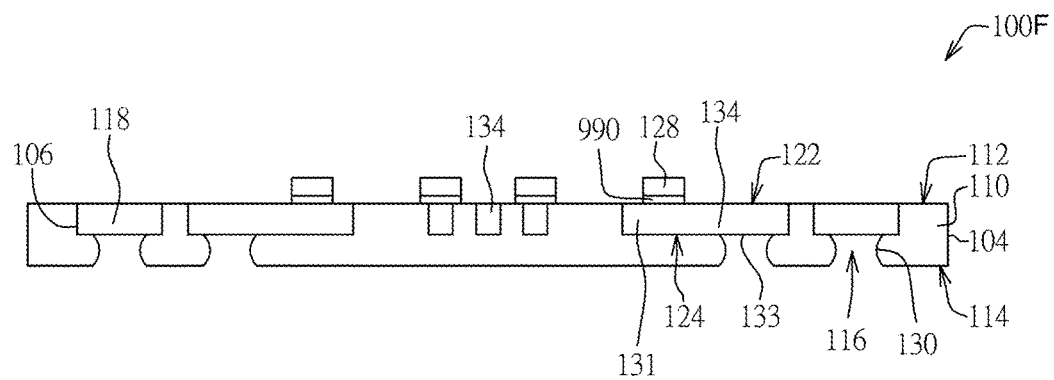
FIG. 6 illustrates a cross-sectional view of a semiconductor substrate structure according to another embodiment of the present disclosure.

FIG. 6 illustrates a cross-sectional view of a semiconductor substrate structure 100F according to another embodiment of the present disclosure. The semiconductor substrate structure 100F of this embodiment is similar to the semiconductor substrate structure 100A illustrated in FIG. 1, except that the semiconductor substrate structure 100F further comprises one or more conductive posts 128. The conductive posts 128 protrude from the first conductive surface 122, and are disposed on respective ones of the bonding pads 131, so as to be electrically connected to the conductive structure 106. The material of the conductive posts 128 may be copper; however, the present disclosure is not limited thereto. In one embodiment, a seed layer 990 may be disposed under the conductive posts 128, that is, a portion of the seed layer 990 is disposed between each conductive post 128 and its respective bonding pad 131. However, the seed layer 990 may be omitted.

Figure 7:
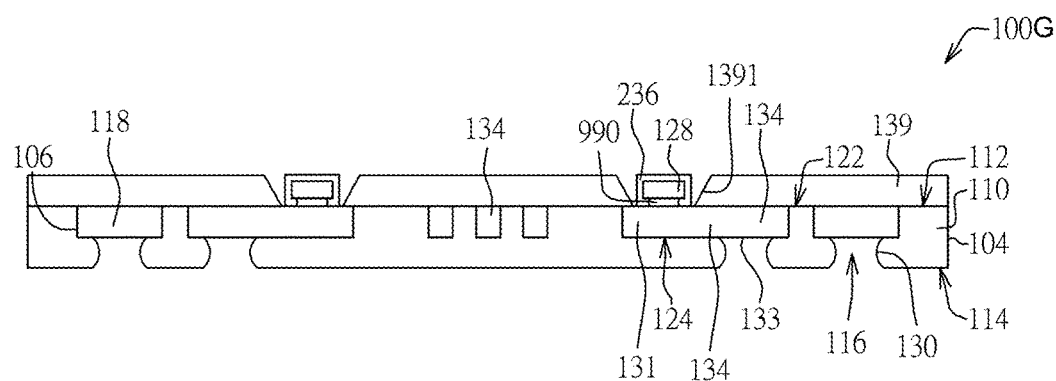
FIG. 7 illustrates a cross-sectional view of a semiconductor substrate structure according to another embodiment of the present disclosure.

FIG. 7 illustrates a cross-sectional view of a semiconductor substrate structure 100G according to another embodiment of the present disclosure. The semiconductor substrate structure 100G of this embodiment is similar to the semiconductor substrate structure 100F illustrated in FIG. 6, except that the semiconductor substrate structure 100G further comprises one or more surface finish layers 236 and a solder resist layer 139. The surface finish layers 236 are disposed on respective ones of the conductive posts 128. In some embodiments, as illustrated in FIG. 7, a width of a seed layer 990 portion under a respective conductive post 128 is less than a width of the respective conductive post 128, thus, the surface finish layer 236 covers top and side surfaces of the conductive post 128 and a portion of the bottom surface of the conductive post 128, and further extends into the space between the conductive post 128 and the bonding pad 131. The solder resist layer 139 is disposed on the first conductive surface 122 and the first dielectric surface 112, and includes one or more openings 1391 to expose the conductive post(s) 128. The material of the solder resist layer 139 may be the same as, or different from, the material of the dielectric layer 110. Generally, the material of the solder resist layer 139 may be, for example, one of, or a combination of, pre-preg, Ajinomoto build-up film (ABF), photoresist, liquid crystal polymer (LCP), polyimide (PI) or photo-sensitive resin. Each layer of the one or more surface finish layers 236 may be formed of, for example, nickel, gold, silver or an alloy thereof.

Figure 8:
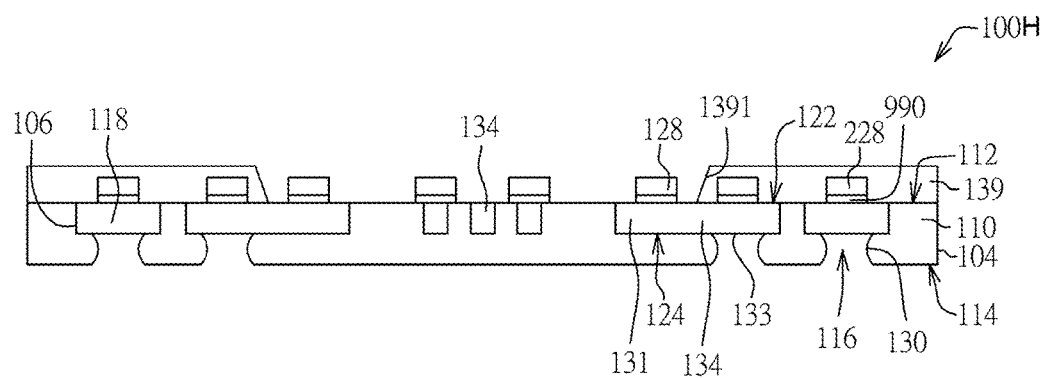
FIG. 8 illustrates a cross-sectional view of a semiconductor substrate structure according to another embodiment of the present disclosure.

FIG. 8 illustrates a cross-sectional view of a semiconductor substrate structure 100H according to another embodiment of the present disclosure. The semiconductor substrate structure 100H of this embodiment is similar to the semiconductor substrate structure 100F illustrated in FIG. 6, except that the semiconductor substrate structure 100H further comprises a solder resist layer 139 and one or more first metal bumps 228. The first metal bumps 228 are disposed on upper surfaces of respective ones of the ball pads 133. The material of the first metal bumps 228 may be copper; however, the present disclosure is not limited thereto. In one embodiment, a seed layer 990 may be disposed under the first metal bumps 228, that is, a portion of the seed layer 990 is disposed between each first metal bump 228 and its respective ball pad 133. However, the seed layer 990 may be omitted. The first metal bumps 228 can enhance the strength of the ball pads 133. Thus, during a process of providing an encapsulant to cover a die on the semiconductor substrate, the ball pads 133 have a reduced risk of cracking or other damage. The solder resist layer 139 is disposed on the first conductive surface 122 and the first dielectric surface 112, and covers the first metal bumps 228. The solder resist layer 139 includes an opening 1391 to expose one or more conductive posts 128. The material of the solder resist layer 139 may be the same as, or different from, that of the dielectric layer 110. Generally, the material of the solder resist layer 139 may be, for example, one of, or a combination of, pre-preg, Ajinomoto build-up film (ABF), photoresist, liquid crystal polymer (LCP), polyimide (PI) or photo-sensitive resin.

Figure 9:
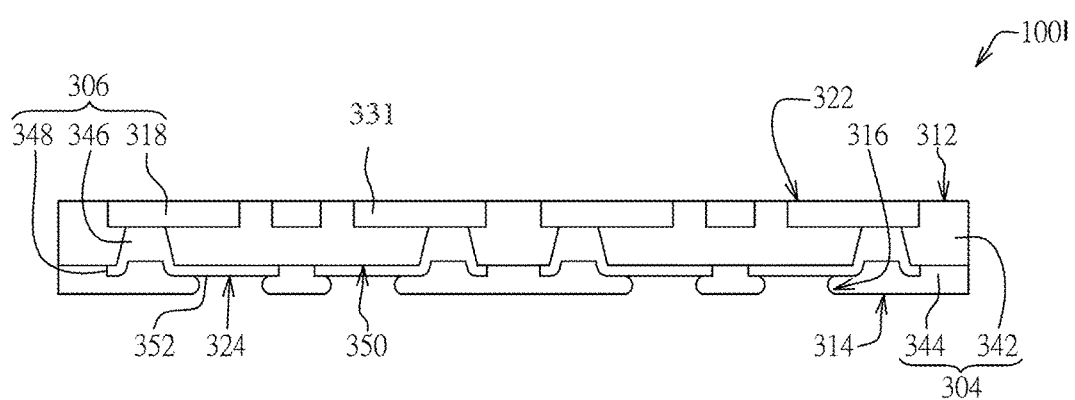
FIG. 9 illustrates a cross-sectional view of a semiconductor substrate structure according to another embodiment of the present disclosure.

FIG. 9 illustrates a cross-sectional view of a semiconductor substrate structure 100I according to another embodiment of the present disclosure. The semiconductor substrate structure 100I of this embodiment is similar to the semiconductor substrate structure 100A illustrated in FIG. 1, and the difference is described as follows. A dielectric structure 304 of the semiconductor substrate structure 100I includes a first dielectric layer 342 and a second dielectric layer 344. The first dielectric layer 342 has a first dielectric surface 312 (corresponding to a first surface of the dielectric structure 304) and a third dielectric surface 350, and the second dielectric layer 344 has a second dielectric surface 314 (corresponding to a second surface of the dielectric structure 304) and one or more dielectric openings 316. The material of the first dielectric layer 342 may be, for example, one of, or a combination of, pre-preg, Ajinomoto build-up film (ABF), photoresist, liquid crystal polymer (LCP), polyimide (PI) or photo-sensitive resin. The material of the second dielectric layer 344 includes, or is formed from, a cured photo-sensitive resin that has an interpenetrating polymer network (IPN) structure. The photo-sensitive resin includes a base resin (e.g., acrylic resin or epoxy resin) and a photo-initiator. In some embodiments, the photo-sensitive resin is CA-40 AUS320 from Taiyo Ink Mfg. Co., Ltd.

The conductive structure 306 of the semiconductor substrate structure 100I comprises a first patterned conductive layer 318, one or more conductive vias 346 and a second patterned conductive layer 348. The dielectric structure 304 covers at least a portion of the conductive structure 306. The first patterned conductive layer 318 has a first conductive surface 322 and one or more bonding pads 331. The first conductive surface 322 is exposed from the first dielectric surface 312 of the first dielectric layer 342. In some embodiments such as the one illustrated in FIG. 9, the first conductive surface 322 is substantially coplanar with the first dielectric surface 312 of the first dielectric layer 342, and the bonding pads 331 are exposed from the first dielectric surface 312. In other embodiments, the first conductive surface 322 is recessed from the first dielectric surface 312 of the first dielectric layer 342. The second patterned conductive layer 348 is disposed on the third dielectric surface 350. The second patterned conductive layer 348 has a conductive surface 324 and one or more ball pads 352. The second conductive surface 324 is recessed from the second dielectric surface 314. One or more dielectric openings 316 expose a portion of the second conductive surface 324. The ball pads 352 are exposed portions of the second conductive surface 324. The ball pads 352 are exposed in respective ones of the dielectric openings 316. Side walls defining the dielectric openings 316 are curved. The conductive vias 346 extend through the first dielectric layer 342 of the dielectric structure 304 and electrically connect the first patterned conductive layer 318 and the second patterned conductive layer 348.

Figure 10:
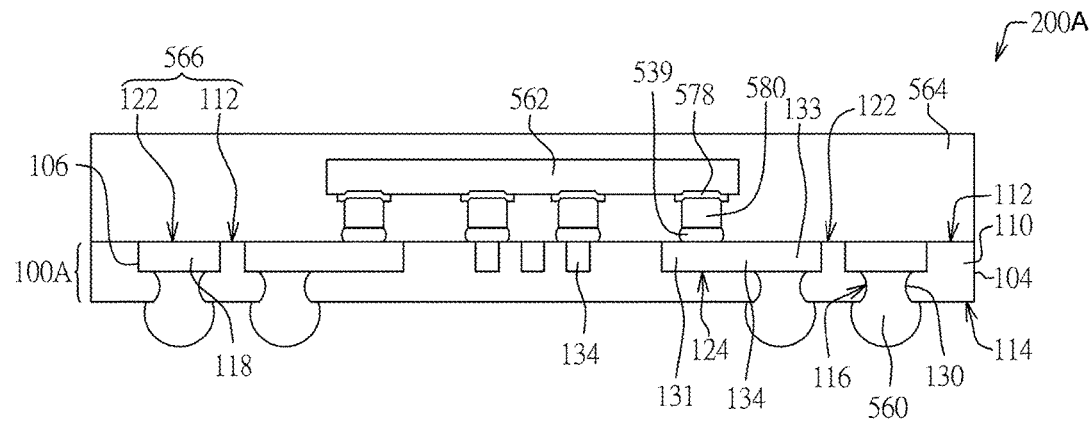
FIG. 10 illustrates a cross-sectional view of a semiconductor package according to an embodiment of the present disclosure.

FIG. 10 illustrates a cross-sectional view of a semiconductor package 200A according to an embodiment of the present disclosure. The semiconductor package 200A comprises a semiconductor substrate structure 100A, one or more solder bumps 560, a semiconductor die 562 and an encapsulant 564. The semiconductor substrate structure 100A of this embodiment is the same as the semiconductor substrate structure 100A illustrated and described with respect to FIG. 1. The solder bumps 560 are disposed in the dielectric openings 116 of the dielectric structure 104, and are physically and electrically connected to respective ones of the ball pads 133. In this embodiment, a space defined by a curved side wall 130 of a dielectric opening 116 and a bottom surface of a ball pad 133 exposed by the dielectric opening 116 provides an interlock function for a corresponding solder bump 560. That is, after the solder bump 560 is disposed in the dielectric opening 116, the solder bump 560 will have a neck portion that conforms with the curved side wall 130, and the neck portion can prevent the solder bump 560 from separating from the ball pad 133. The solder bump 560 protrudes from the second dielectric surface 114 of the dielectric structure 104. The semiconductor die 562 is disposed on a first substrate surface 566 (including the first dielectric surface 112 and the first conductive surface 122 that are substantially coplanar with each other in this embodiment) of the semiconductor substrate structure 100A, and is electrically connected to the bonding pads 131, so as to electrically connect to the first conductive surface 122 of the conductive structure 106.

In this embodiment, the semiconductor die 562 includes one or more under bump metallizations (UBMs) 578 on the active surface thereof and one or more conductive pillars 580 disposed on respective ones of the UBMs 578. The semiconductor die 562 is electrically and physically connected to the first conductive surface 122 of the semiconductor substrate structure 100A through solder 539 on the conductive pillars 580 of the semiconductor die 562. The encapsulant 564 covers the semiconductor die 562, the conductive pillars 580, the solder 539 and a portion of the first substrate surface 566 of the semiconductor substrate structure 100A. In this embodiment, the conductive pillars 580 provide for a sufficiently large space, so that the encapsulant 564 can cover the elements on the active surface of the semiconductor die 562. Thus, an expensive underfill is unnecessary, thereby reducing manufacturing cost.

Figure 11:
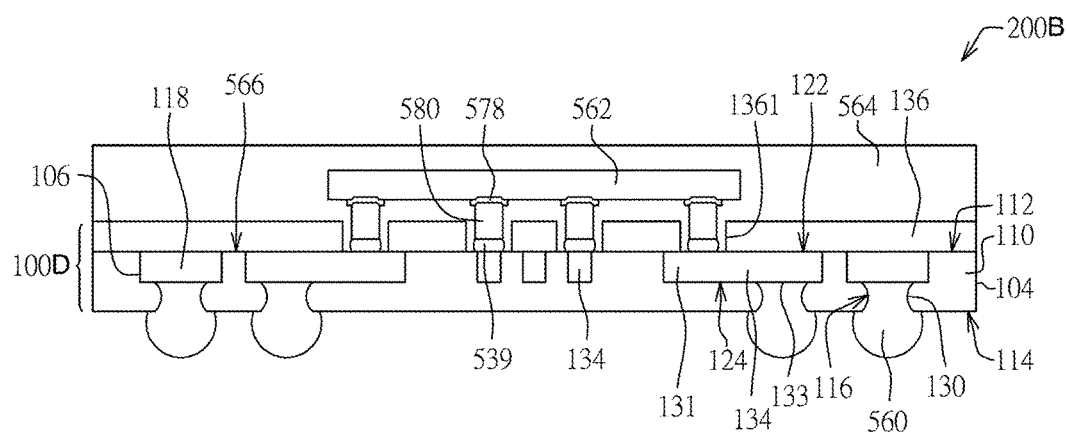
FIG. 11 illustrates a cross-sectional view of a semiconductor package according to another embodiment of the present disclosure.

FIG. 11 illustrates a cross-sectional view of a semiconductor package 200B according to another embodiment of the present disclosure. The semiconductor package 200B comprises a semiconductor substrate structure 100D, one or more solder bumps 560, a semiconductor die 562 and an encapsulant 564. The semiconductor substrate structure 100D of this embodiment is the same as the semiconductor substrate structure 100D illustrated in FIG. 4. The solder bumps 560 are disposed in the dielectric openings 116 of the dielectric structure 104, and are physically and electrically connected to respective ones of the ball pads 133. The semiconductor die 562 is disposed on a first substrate surface 566 (including the first dielectric surface 112 and the first conductive surface 122 that are substantially coplanar with each other in this embodiment) of the semiconductor substrate structure 100D, and is electrically connected to the bonding pads 131, so as to electrically connect to the first conductive surface 122 of the conductive structure 106.

In this embodiment, the semiconductor die 562 includes one or more UBMs 578 on the active surface thereof and one or more conductive pillars 580 disposed on respective ones of the UBMs 578. The semiconductor die 562 is electrically and physically connected to the first conductive surface 122 of the semiconductor substrate structure 100D through solder 539 on the conductive pillars 580 of the semiconductor die 562. The encapsulant 564 covers the semiconductor die 562, the conductive pillars 580, the solder 539 and a portion of the first substrate surface 566 of the semiconductor substrate structure 100D.

Figure 12:
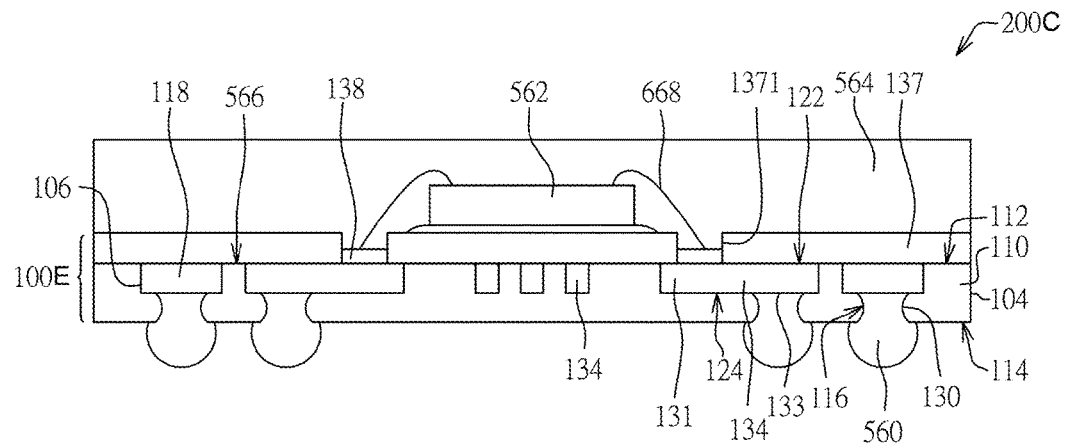
FIG. 12 illustrates a cross-sectional view of a semiconductor package according to another embodiment of the present disclosure.

FIG. 12 illustrates a cross-sectional view of a semiconductor package 200C according to another embodiment of the present disclosure. The semiconductor package 200C comprises a semiconductor substrate structure 100E, one or more solder bumps 560, a semiconductor die 562, one or more bonding wires 668 and an encapsulant 564. The semiconductor substrate structure 100E of this embodiment is the same as the semiconductor substrate structure 100E illustrated in FIG. 5. The solder bumps 560 are disposed in the dielectric openings 116 of the dielectric structure 104, and are physically and electrically connected to respective ones of the ball pads 133. The semiconductor die 562 is disposed on a top surface of the semiconductor substrate structure 100E, and is electrically connected to the bonding pads 131, so as to electrically connect to the first conductive surface 122 of the conductive structure 106.

In this embodiment, the back surface of the semiconductor die 562 is adhered on the solder resist layer 137, and the active surface of the semiconductor die 562 is electrically connected to the surface finish layers 138 on the first conductive surface 122 of the semiconductor substrate structure 100E through the bonding wires 668. The encapsulant 564 covers the semiconductor die 562, the bonding wires 668, the surface finish layers 138 and the solder resist layer 137.

Figure 13:
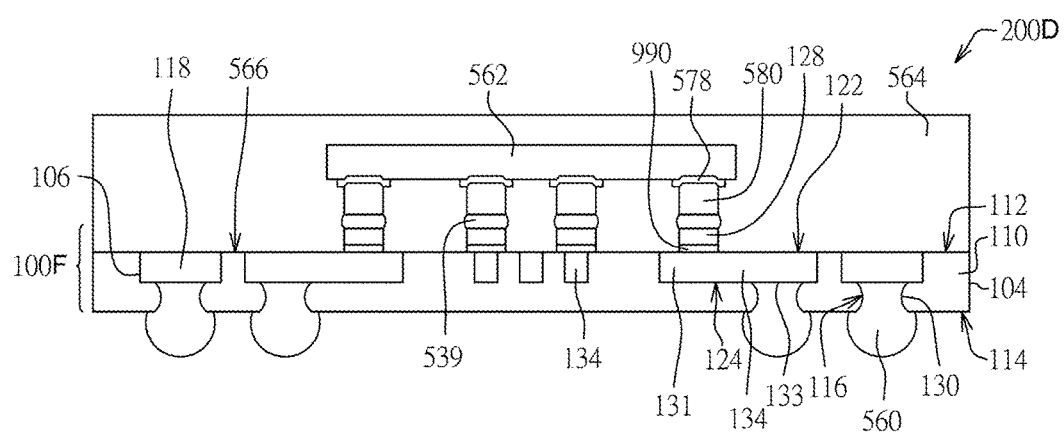
FIG. 13 illustrates a cross-sectional view of a semiconductor package according to another embodiment of the present disclosure.

FIG. 13 illustrates a cross-sectional view of a semiconductor package 200D according to another embodiment of the present disclosure. The semiconductor package 200D of this embodiment is similar to the semiconductor package 200A illustrated in FIG. 10, and the difference is described as follows. The semiconductor package 200D comprises a semiconductor substrate structure 100F (FIG. 6), one or more solder bumps 560, a semiconductor die 562 and an encapsulant 564. The semiconductor substrate structure 100F includes one or more conductive posts 128, as described with respect to FIG. 6. The conductive posts 128 protrude from the first conductive surface 122, and are disposed on respective ones of the bonding pads 131. The solder 539 on the conductive pillars 580 of the semiconductor die 562 is physically and electrically connected to the conductive posts 128 of the semiconductor substrate structure 100F.

Figure 14:
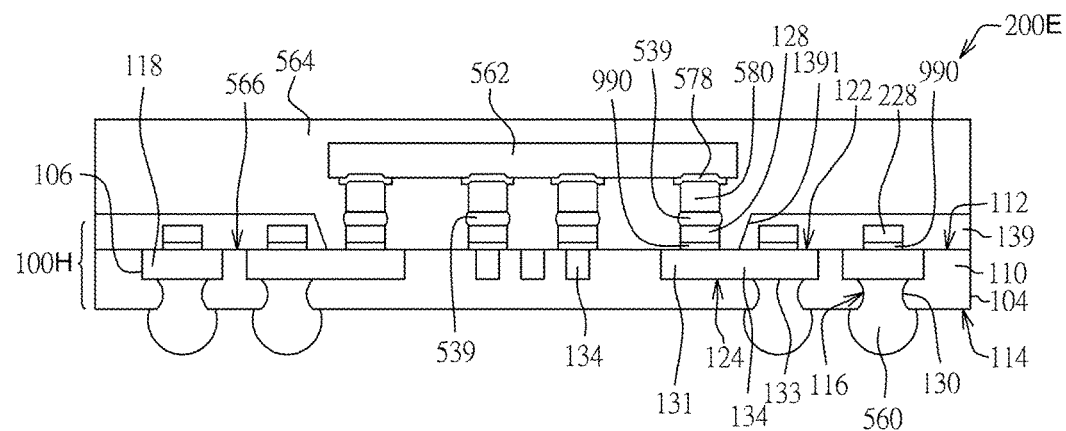
FIG. 14 illustrates a cross-sectional view of a semiconductor package according to another embodiment of the present disclosure.

FIG. 14 illustrates a cross-sectional view of a semiconductor package 200E according to another embodiment of the present disclosure. The semiconductor package 200E of this embodiment is similar to the semiconductor package 200D illustrated in FIG. 13, and the difference is described as follows. The semiconductor package 200E comprises a semiconductor substrate structure 100H (FIG. 8), one or more solder bumps 560, a semiconductor die 562 and an encapsulant 564. The semiconductor substrate structure 100H includes a solder resist layer 139 and one or more first metal bumps 228, as described with respect to FIG. 8. The first metal bumps 228 are disposed on the upper surfaces of respective ones of the ball pads 133. The first metal bumps 228 can enhance the strength of the ball pads 133. Thus, during a process of providing the encapsulant 564 to cover the semiconductor die 562 on the semiconductor substrate, the ball pads 133 have a reduced risk of cracking or other damage. The solder resist layer 139 covers the first metal bumps 228, and has an opening 1391 to expose the conductive posts 128.

Figure 15:
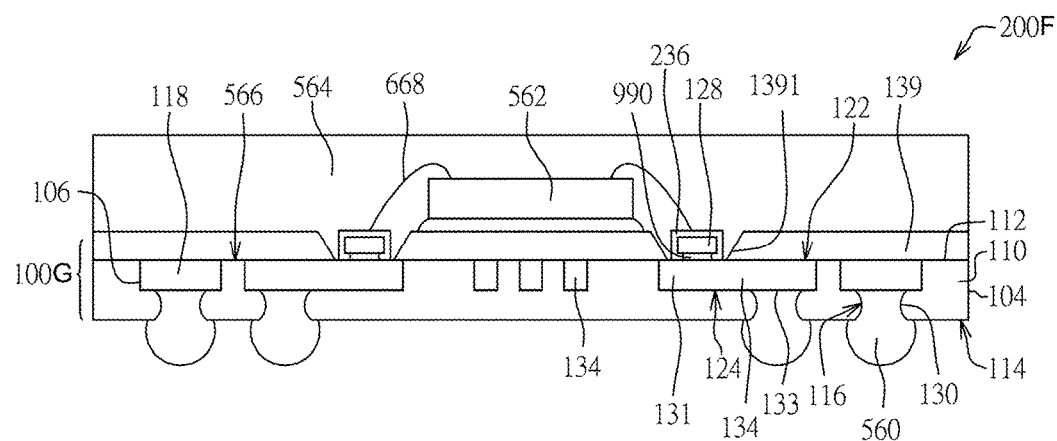
FIG. 15 illustrates a cross-sectional view of a semiconductor package according to another embodiment of the present disclosure.

FIG. 15 illustrates a cross-sectional view of a semiconductor package 200F according to another embodiment of the present disclosure. The semiconductor package 200F comprises a semiconductor substrate structure 100G (FIG. 7), one or more solder bumps 560, a semiconductor die 562, one or more bonding wires 668 and an encapsulant 564. The solder bumps 560 are disposed in the dielectric openings 116 of the dielectric structure 104, and are physically and electrically connected to respective ones of the ball pads 133. The semiconductor substrate structure 100G includes one or more surface finish layers 236 and a solder resist layer 139, as described with respect to FIG. 7.

The semiconductor die 562 is disposed on an upper surface of the semiconductor substrate structure 100G, and is electrically connected to the bonding pads 131, so as to electrically connect to the first conductive surface 122 of the conductive structure 106. In this embodiment, the back surface of the semiconductor die 562 is adhered on the solder resist layer 139, and the active surface of the semiconductor die 562 is electrically connected to the surface finish layers 236 on the conductive post 128 through the bonding wires 668. The encapsulant 564 covers the semiconductor die 562, the bonding wires 668, the one or more surface finish layers 236 and the solder resist layer 139.

FIG. 16A, FIG. 16B, FIG. 16C, FIG. 16D, FIG. 16E, FIG. 16F, FIG. 16G, FIG. 16H, FIG. 16I, FIG. 16J, FIG. 16K, and FIG. 16L illustrate a method of manufacturing a semiconductor package according to an embodiment of the present disclosure.

Figure 16A:
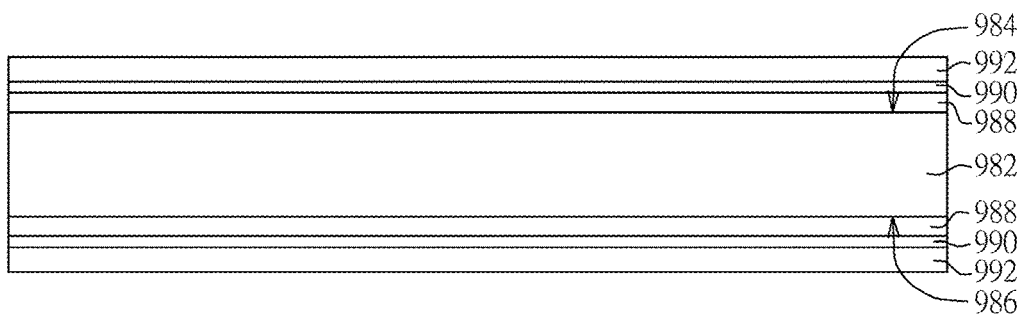
FIG. 16A, FIG. 16B, FIG. 16C, FIG. 16D, FIG. 16E, FIG. 16F, FIG. 16G, FIG. 16H, FIG. 16I, FIG. 16J, FIG. 16K, and FIG. 16L illustrate a method of manufacturing a semiconductor package according to an embodiment of the present disclosure.

Referring to FIG. 16A, a first carrier 982 is provided. The first carrier 982 has a first surface 984 and a second surface 986 opposite to the first surface 984. In one embodiment, the first carrier 982 includes bismaleimide triazine (BT); however, the present disclosure is not limited thereto. A conductive film 988 and a seed layer 990 are disposed on the first surface 984 and the second surface 986. Then, a photoresist layer 992 is disposed on the seed layer 990. In one embodiment, the conductive film 988 is a copper foil with a thickness of about 18 μm, the seed layer 990 is a copper foil with a thickness of about 3 μm, and the photoresist layer 992 is a laminated dry film; however, the present disclosure is not limited thereto.

Figure 16B:
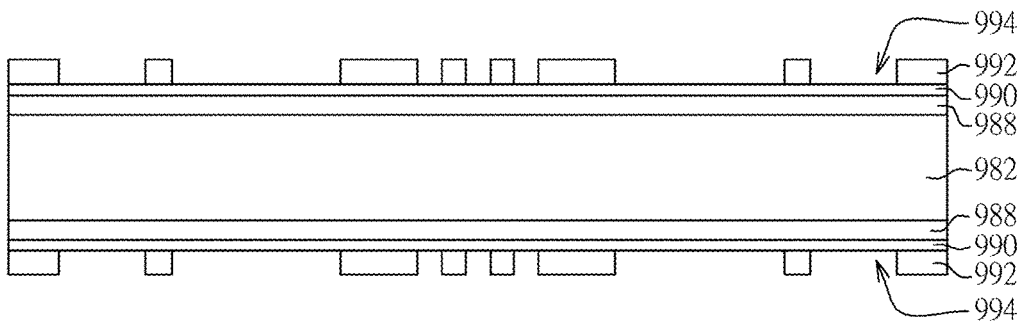

Referring to FIG. 16B, the photoresist layer 992 is patterned. The patterning method may include exposure and development, so as to define a pattern opening 994 in the photoresist layer 992 and expose the seed layer 990.

Figure 16C:
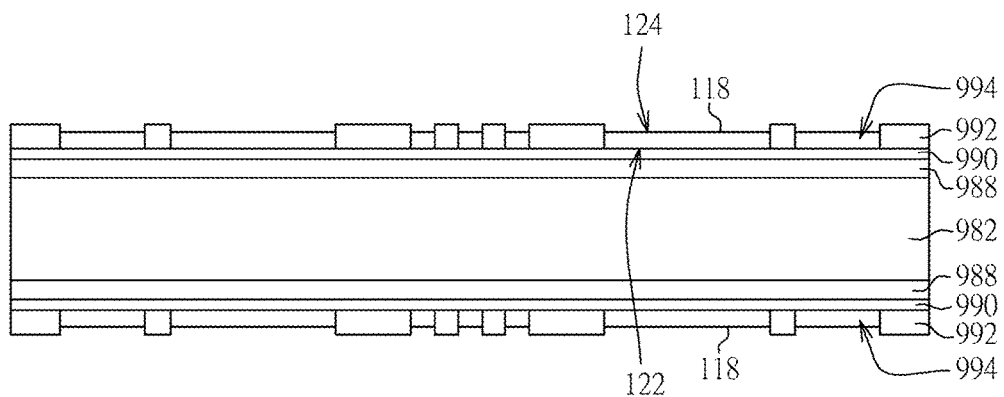

Referring to FIG. 16C, a first patterned conductive layer 118 is formed on the seed layer 990 exposed from the pattern opening 994 of the photoresist layer 992. In one embodiment, the first patterned conductive layer 118 is formed by plating. In one embodiment, a thickness of the first patterned conductive layer 118 is about 20 μm, and a material of the first patterned conductive layer 118 is copper; however, the present disclosure is not limited thereto, and other metals or metal alloys, for example, can be used. In the embodiment of FIG. 16C, the conductive traces of the first patterned conductive layer 118 (such as the first conductive traces 134 of FIG. 1) may be made to be fine pitch (e.g., less than or equal to 15 μm). In this embodiment, the first patterned conductive layer 118 has a first conductive surface 122 and a second conductive surface 124 opposite to the first conductive surface 122. The first conductive surface 122 is at the seed layer 990, and the second conductive surface 124 is exposed by the photoresist layer 992.

Figure 16D:
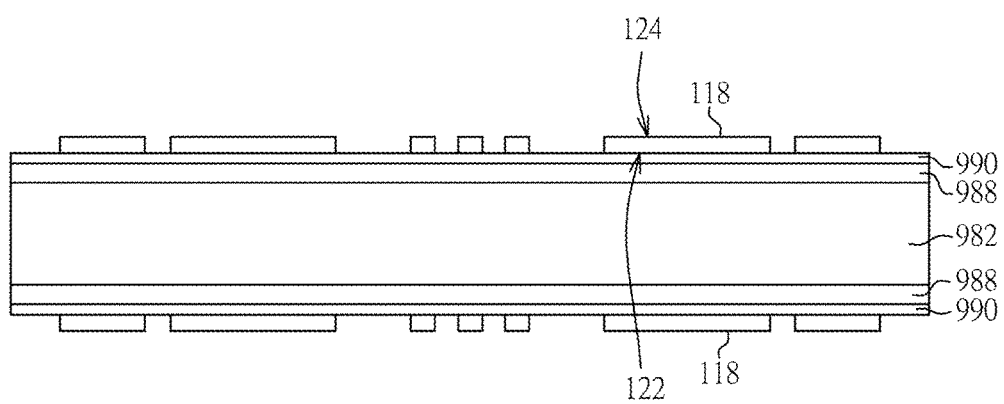

Referring to FIG. 16D, the photoresist layer 992 as shown in FIG. 16C is removed.

Figure 16E:
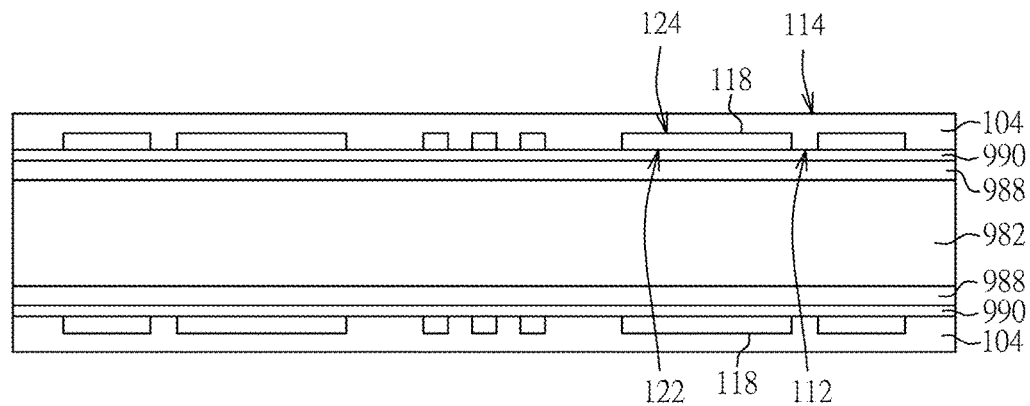

Referring to FIG. 16E, the dielectric structure 104 is formed to cover the seed layer 990 and the first patterned conductive layer 118. In some embodiments, the dielectric structure 104 is a dielectric layer, the material of which is a photo-sensitive resin that includes a base resin (e.g., acrylic resin or epoxy resin) and a photo-initiator. In some embodiments, the photo-sensitive resin is CA-40 AUS320 from Taiyo Ink Mfg. Co., Ltd. The dielectric structure 104 has a first dielectric surface 112 and a second dielectric surface 114 opposite to the first dielectric surface 112. The first conductive surface 122 is substantially coplanar with the first dielectric surface 112.

Then, the dielectric structure 104 is pre-cured. For example, a light beam is applied to the photo-sensitive resin so that the photo-sensitive resin is partially cured by reacting the photo-initiator with the base resin to a B-stage state.

Figure 16F:
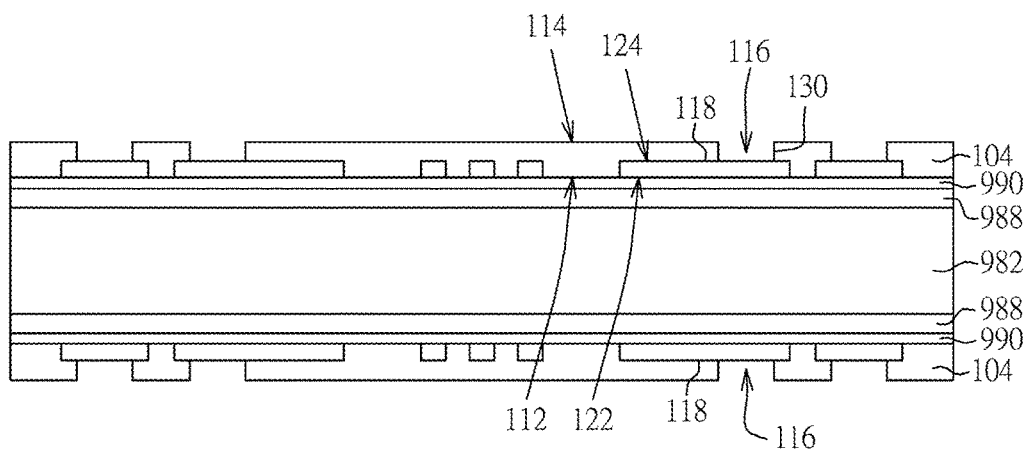

Referring to FIG. 16F, the dielectric structure 104 is patterned to define one or more dielectric openings 116 on the second dielectric surface 114 to expose a portion of the second conductive surface 124. The patterning may include, for example, exposing and developing the dielectric structure 104. The dielectric opening 116 is defined by a side wall 130.

Figure 16G:
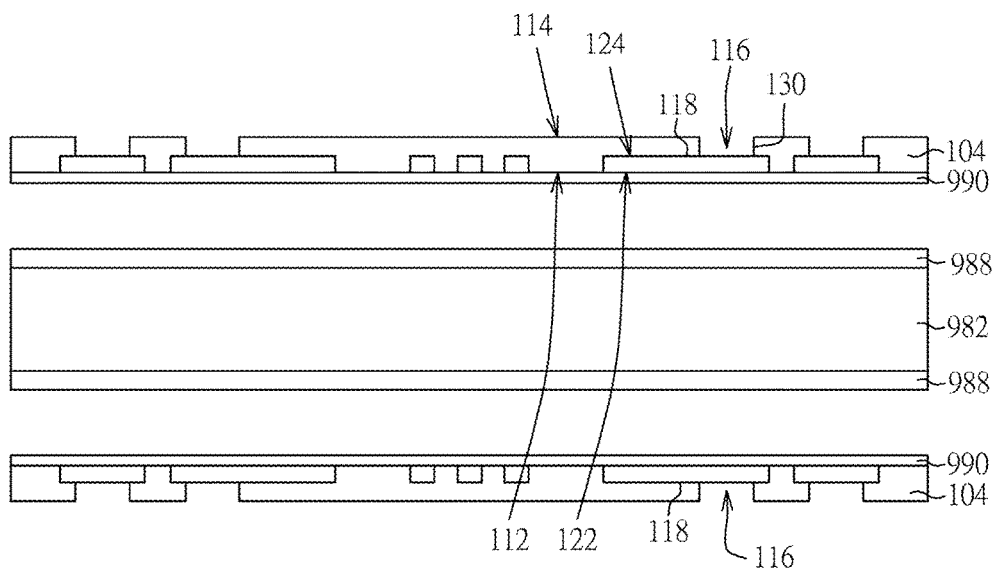

Referring to FIG. 16G, the seed layer 990 is separated from the conductive film 988, so that two substrate structures (an upper substrate structure and a lower substrate structure) are separated from the first carrier 982.

Figure 16H:
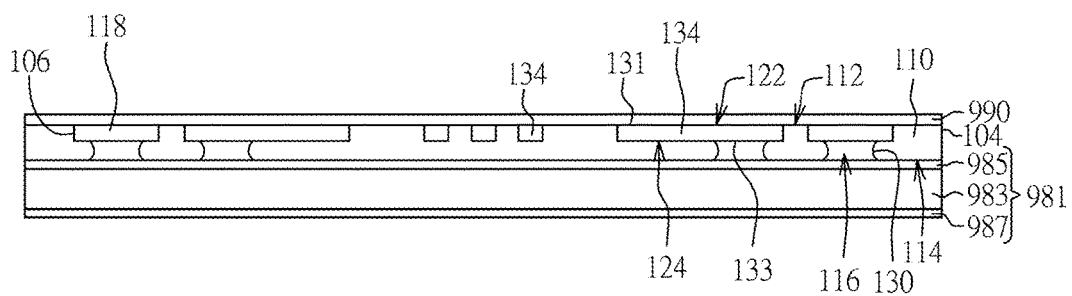

Referring to FIG. 16H, a second carrier 981 is provided on the second dielectric surface 114. In some embodiments, the second carrier 981 comprises a core plate 983, a first metal layer 985 and a second metal layer 987. In one embodiment, the core plate 983 includes bismaleimide triazine (BT), and the first metal layer 985 and the second metal layer 987 are copper foils disposed on two sides of the core plate 983. The second dielectric surface 114 of the dielectric structure 104 is attached or adhered to the first metal layer 985.

As noted above, the dielectric structure 104 is photo-sensitive resin currently in a B-stage, so that the dielectric structure 104 can be adhered to the second carrier 981 tightly. In some embodiments, the dielectric structure 104 is adhered to the second carrier 981 by hot pressing, thus, the photo-sensitive resin is further thermally cured so that the photo-sensitive resin progresses to a C-stage state, and has an interpenetrating polymer network (IPN) structure. The side wall 130 defining the dielectric opening 116 is curved (as was illustrated for the embodiment of FIG. 1A) due to the photo-sensitive resin in the dielectric structure 104 (in a B-stage state) being pressed onto the second carrier 981: the middle portion of the side wall 130 extrudes into the dielectric opening 116 from the pressure, and retains the resulting curved shape when cured to the C-stage state.

Figure 16I:
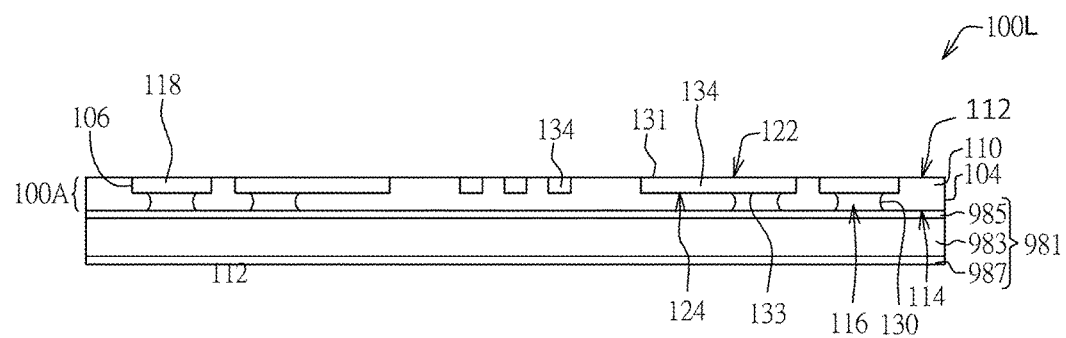

Referring to FIG. 16I, the seed layer 990 as shown in FIG. 16H may be removed wholly or in part. In one embodiment, the seed layer 990 is removed by flash etching. After this point, the semiconductor substrate structure 100A (FIG. 1) is obtained. The second carrier 981 enhances the rigidity of semiconductor substrate structure 100A during subsequent encapsulation. In one embodiment, following removal of the seed layer 990 wholly, the first conductive surface 122 may be further etched so that the first conductive surface 122 is recessed from the first dielectric surface 112, as was shown for the embodiment of FIG. 2.

Figure 16J:
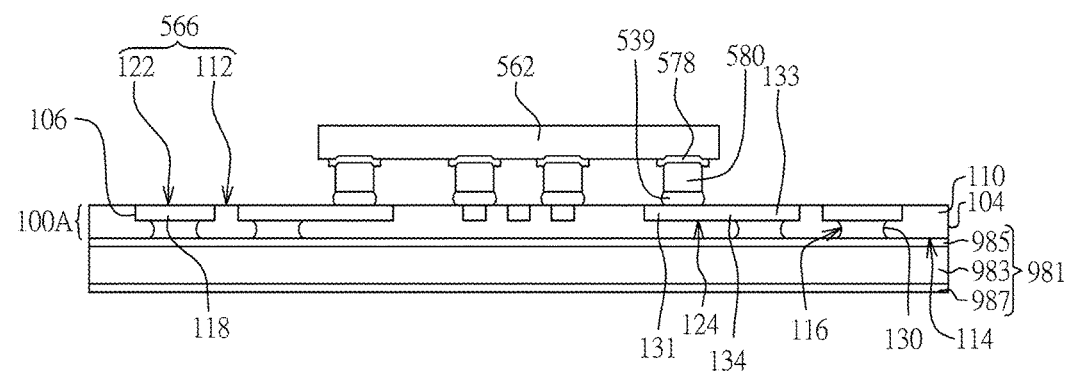

Referring to FIG. 16J, a semiconductor die 562 is disposed on a first substrate surface 566 (including the first dielectric surface 112 and the first conductive surface 122 that are substantially coplanar with each other in this embodiment) of the semiconductor substrate structure 100A, and is electrically connected to the bonding pads 131, so as to electrically connect to the first conductive surface 122 of the conductive structure 106. In this embodiment, the semiconductor die 562 includes one or more UBMs 578 on the active surface thereof and one or more conductive pillars 580 disposed on respective ones of the UBMs 578. The conductive pillars 580 of the semiconductor die 562 include solder 539, and the semiconductor die 562 is electrically and physically connected to the first conductive surface 122 of the semiconductor substrate structure 100A through the solder 539.

Figure 16K:
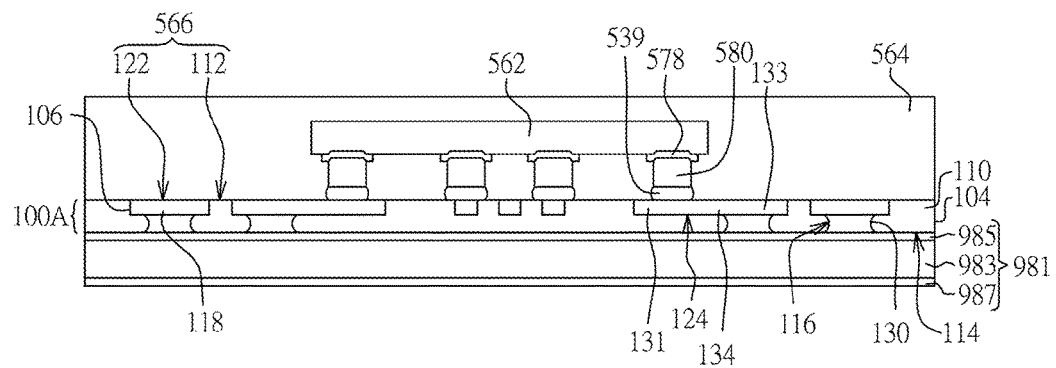

Referring to FIG. 16K, an encapsulant 564 is applied to cover the semiconductor die 562 and the first substrate surface 566 of the semiconductor substrate structure 100A. In this embodiment, the encapsulant 564 covers the semiconductor die 562, the conductive pillars 580, the solder 539 and a portion of the first substrate surface 566 of the semiconductor substrate structure 100A. In this embodiment, the conductive pillars 580 form a sufficiently large space, so that the encapsulant 564 can cover the components on the active surface of the semiconductor die 562. Thus, an expensive underfill is unnecessary, thereby reducing manufacturing cost.

Figure 16L:
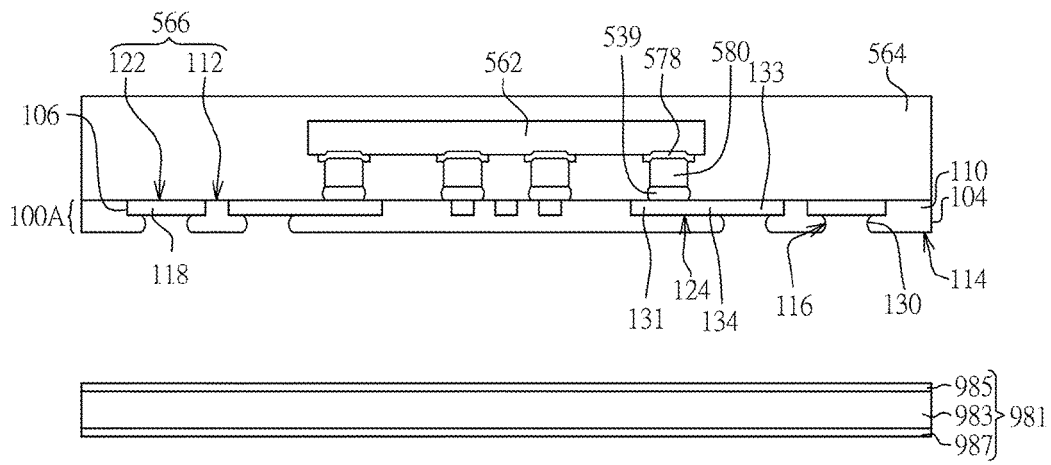

Referring to FIG. 16L, the second carrier 981 is removed. In some embodiments, the dielectric structure 104 is separated from the first metal layer 985, so that the upper structure is separated from the second carrier 981 directly. In other embodiments, the first metal layer 985 is a two-layered structure which includes an outer metal layer and an inner metal layer, where the inner metal layer is disposed between the outer metal layer and the core plate 983. The dielectric structure 104 is adhered to the outer metal layer in (FIG. 16H). Then (FIG. 16L), the outer metal layer is separated from the inner metal layer by stripping, so that the upper structure (including the outer metal layer) is separated from the second carrier 981. Then (also FIG. 16L), the outer metal layer is removed by etching. Meanwhile, the etchant for the outer metal layer will enter the dielectric openings 116 to etch the exposed surfaces of the ball pads 133 to create a recess portion 132 (as in FIG. 3).

Solder bumps may be disposed in the dielectric openings 116 of the dielectric structure 104, to physically and electrically connect to respective ones of the ball pads 133. The solder bumps may protrude from the second dielectric surface 114 of the dielectric structure 104 (such as shown for the semiconductor package 200A including semiconductor substrate structure 100A, as illustrated in FIG. 10).

FIG. 17A, FIG. 17B, FIG. 17C, FIG. 17D, FIG. 17E, FIG. 17F, FIG. 17G, and FIG. 17H illustrate a method of manufacturing a semiconductor package according to another embodiment of the present disclosure. The initial steps of this embodiment are same as FIG. 16A to FIG. 16H, and the following steps are subsequent to FIG. 16H.

Figure 17A:
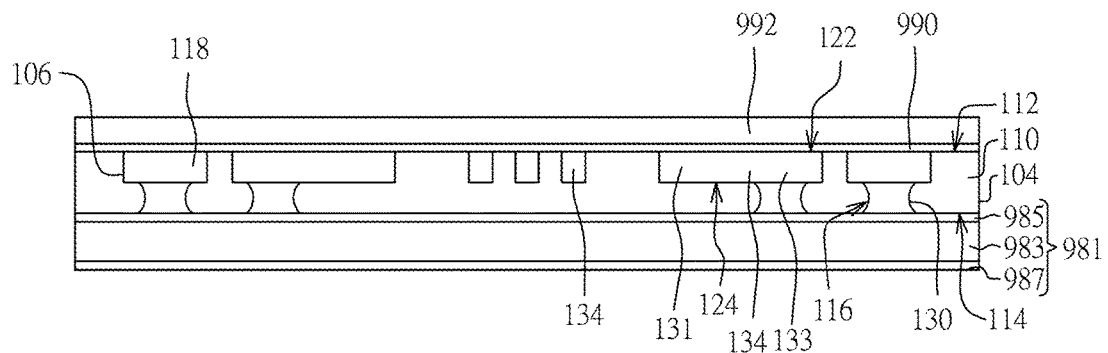
FIG. 17A, FIG. 17B, FIG. 17C, FIG. 17D, FIG. 17E, FIG. 17F, FIG. 17G, and FIG. 17H illustrate a method of manufacturing a semiconductor package according to another embodiment of the present disclosure.

Referring to FIG. 17A, a photoresist layer 992 is disposed on the seed layer 990. In one embodiment, the photoresist layer 992 is a laminated dry film; however, the present disclosure is not limited thereto.

Figure 17B:
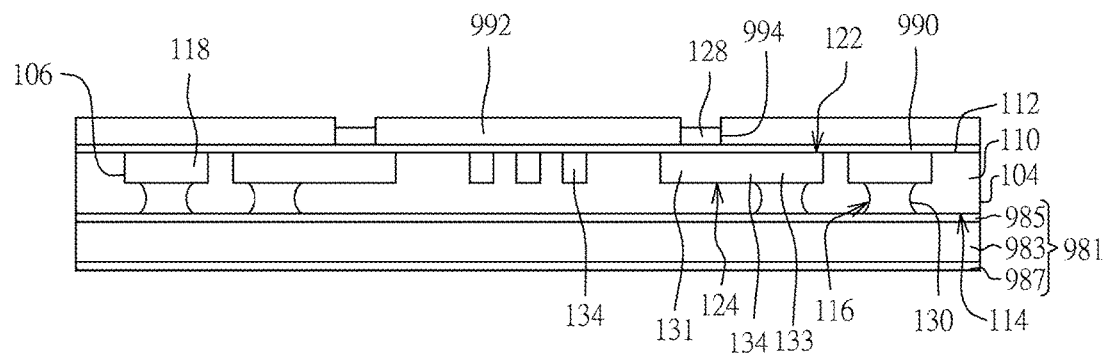

Referring to FIG. 17B, the photoresist layer 992 is patterned to define a plurality of openings 994 to expose a portion of the seed layer 990 corresponding to the bonding pads 131. The patterning method may include, for example, exposing and developing the photoresist layer 992. Then, conductive posts 128 are formed on the seed layer 990 exposed by the openings 994. The material of the conductive posts 128 may be, for example, copper or another metal, or an alloy, which may be formed by plating.

Figure 17C:
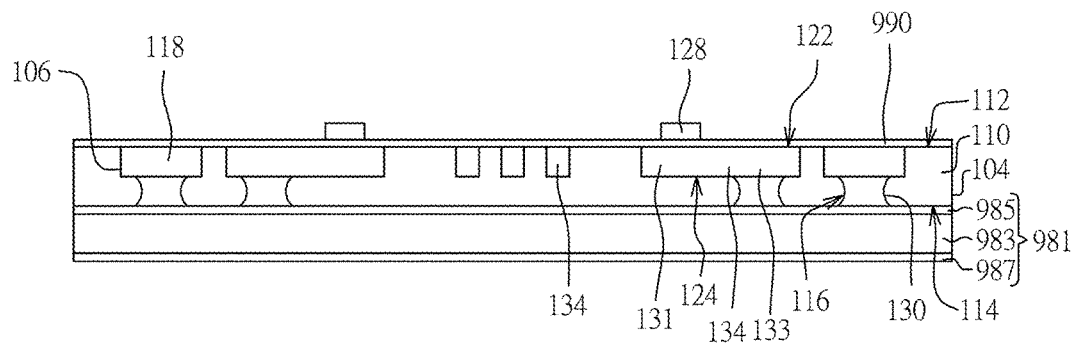

Referring to FIG. 17C, the photoresist layer 992 as shown in FIG. 17B is removed.

Figure 17D:
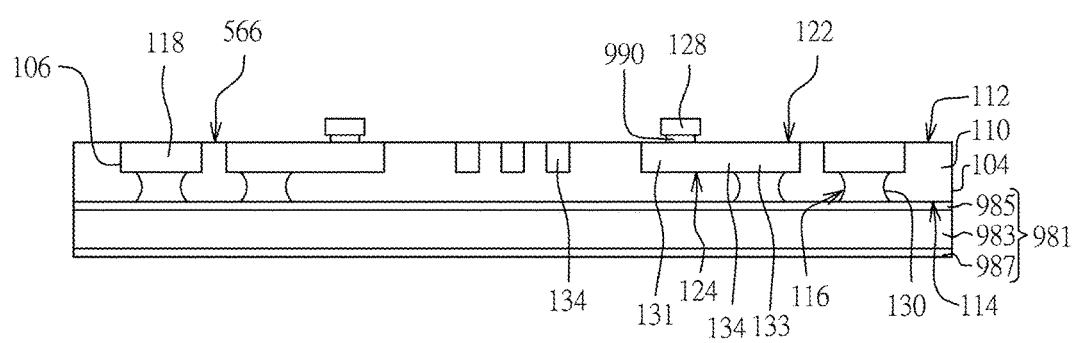

Referring to FIG. 17D, the seed layer 990 as shown in FIG. 17C may be removed. In one embodiment, the seed layer 990 is removed by flash etching. The portion of the seed layer 990 that is covered by the conductive posts 128 will not be fully etched, and may become part of the conductive post 128. In the embodiment illustrated in FIG. 17D, a portion of the seed layer 990 is etched. This is because the lattice of seed layer 990 is different from that of the conductive posts 128, and, the etching rate of the seed layer 990 in the etchant is greater than that of the conductive posts 128. Therefore, most of the seed layer 990 is etched, and the conductive posts 128 can serve as a mask for portions of the seed layer 990 under the conductive posts 128. As a result, after etching, the width of a seed layer 990 portion remaining under a conductive post 128 is less than a width of the conductive post 128, as shown in FIG. 17D.

Figure 17E:
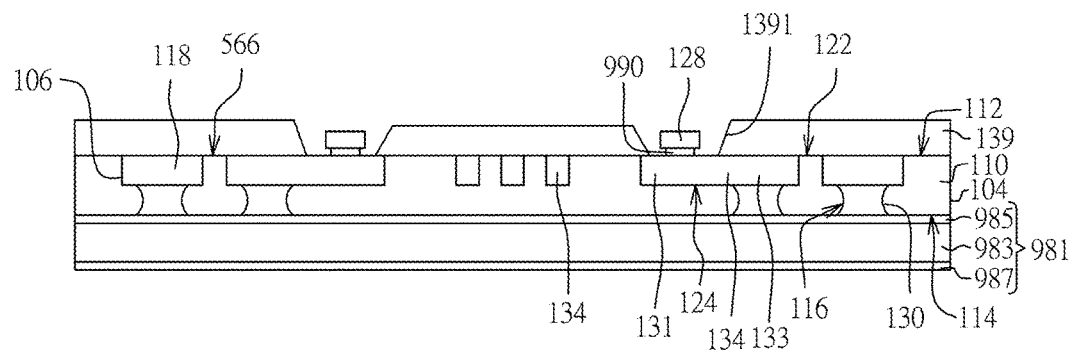

Referring to FIG. 17E, a solder resist layer 139 is formed on first substrate surface 566 (including the first dielectric surface 112 and the first conductive surface 122 that are substantially coplanar with each other in this embodiment). The solder resist layer 139 defines one or more openings 1391 to expose the conductive posts 128. The material of the solder resist layer 139 may be same as, or different from, that of the dielectric layer 110.

Figure 17F:
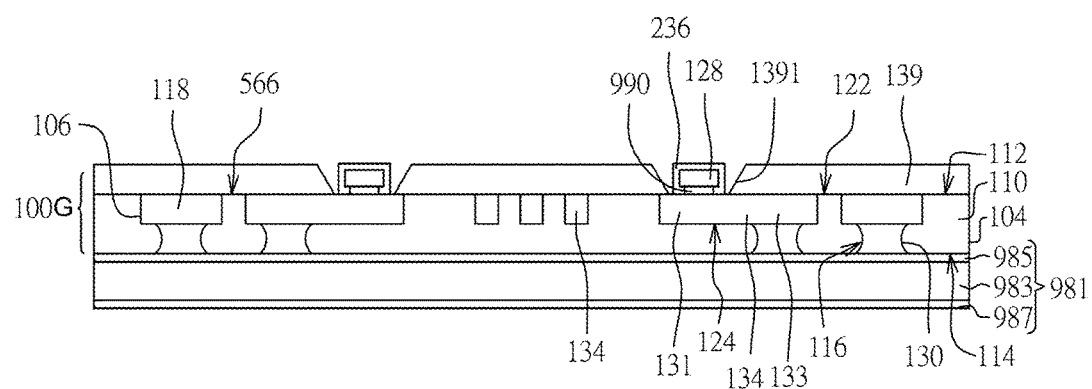

Referring to FIG. 17F, one or more surface finish layers 236 are formed on respective ones of the conductive posts 128. Because the width of a seed layer 990 portion under a respective conductive post 128 is less than the width of the respective conductive post 128, the surface finish layers 236 cover top and side surfaces of the conductive post 128 and part of a bottom surface of the conductive post 128, and further extends into the space between the conductive post 128 and the bonding pad 131. The surface finish layers 236 may be formed by plating. The material of each of the surface finish layers 236 may include gold, silver, or nickel or an alloy thereof; however, the present disclosure is not limited thereto. After this point, the semiconductor substrate structure 100G (FIG. 7) is obtained, connected to the second carrier 981.

Figure 17G:
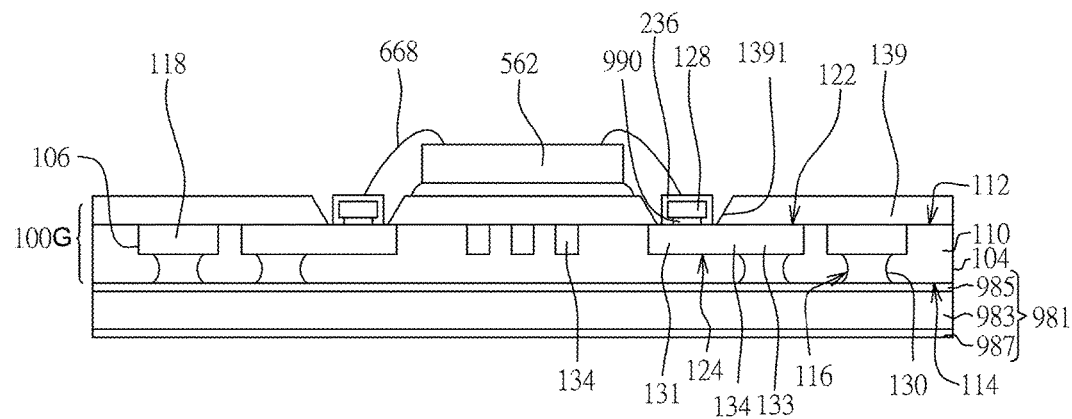

Referring to FIG. 17G, the semiconductor die 562 is disposed on a top surface of the semiconductor substrate structure 100G, and is electrically connected to the bonding pads 131, so as to electrically connect to the first conductive surface 122 of the conductive structure 106. In this embodiment, the back surface of the semiconductor die 562 is adhered on the solder resist layer 139, and the active surface of the semiconductor die 562 is electrically connected to the surface finish layers 236 on the conductive post 128 of the semiconductor substrate structure 100G through the bonding wires 668.

Figure 17H:
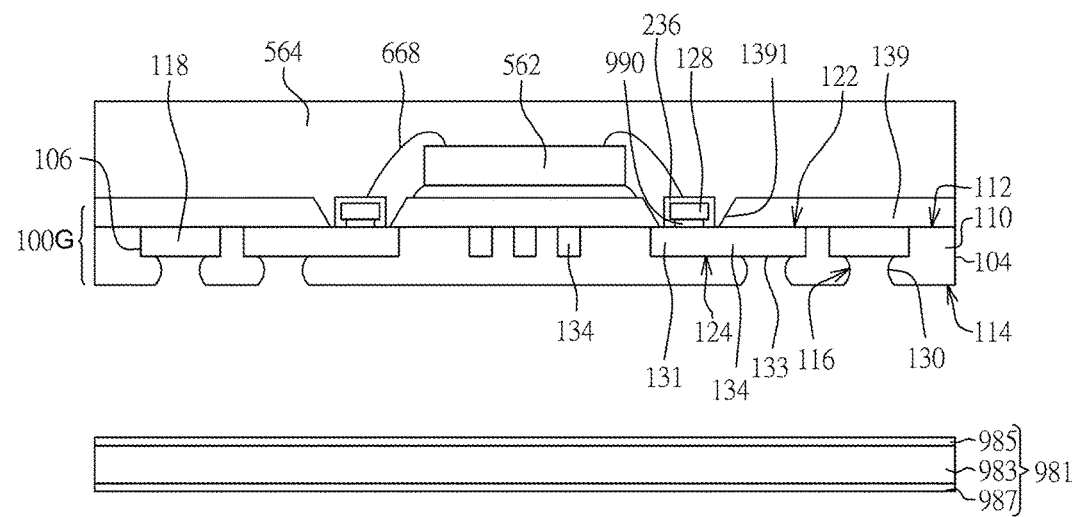

Referring to FIG. 17H, an encapsulant 564 is applied to cover the semiconductor die 562, the bonding wires 668, the surface finish layers 236 and the solder resist layer 139. After wire bonding (FIG. 17G) and molding (FIG. 17H), the second carrier 981 is removed. In some embodiments, the dielectric structure 104 is separated from the first metal layer 985, so that the upper structure is separated from the second carrier 981. Solder bumps may be disposed in the dielectric openings 116 of the dielectric structure 104, to physically and electrically connect to respective ones of the ball pads 133, such as shown for the semiconductor package 200F as illustrated in FIG. 15.

As used herein and not otherwise defined, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Two surfaces can be deemed to be coplanar or substantially coplanar if a displacement between the two surfaces is, for example, no greater than 1 µm, no greater than 0.5 µm, or no greater than 0.2 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor substrate structure, comprising:
   a conductive structure having a first conductive surface and a second conductive surface opposite to the first conductive surface, wherein the conductive structure includes at least one conductive trace; and
   a dielectric structure covering at least a portion of the conductive structure, and having a first dielectric surface and a second dielectric surface opposite to the first dielectric surface, wherein the first conductive surface does not protrude from the first dielectric surface, the second conductive surface is recessed from the second dielectric surface, the dielectric structure is a homogeneous dielectric layer that includes, or is formed from, a cured photo-sensitive resin, and the dielectric structure defines a dielectric opening in the second dielectric surface to expose a portion of the second conductive surface, wherein a side wall defining the dielectric opening is curved, the dielectric opening has a first width at the second dielectric surface and a second width at a middle portion of the dielectric opening, the first width is greater than the second width, and an entirety of the side wall of the dielectric opening in cross-section has a continuous curvature.

2. The semiconductor substrate structure according to claim 1, wherein the first conductive surface is recessed from the first dielectric surface.

3. The semiconductor substrate structure according to claim 1, wherein a thickness of the semiconductor substrate structure is in a range from about 20 µm to about 60 µm.

4. The semiconductor substrate structure according to claim 1, wherein the conductive structure includes a ball pad and a metal bump disposed on a first surface of the ball pad, and wherein the dielectric opening exposes a portion of a second surface of the ball pad.

5. The semiconductor substrate structure according to claim 1, wherein the conductive structure further includes a bonding pad and a conductive post disposed on a surface of the bonding pad.

6. The semiconductor substrate structure according to claim 5, wherein the conductive structure further includes a seed layer and a surface finish layer, a portion of the seed layer is disposed between the conductive post and the bonding pad, a width of the seed layer portion is less than a width of the conductive post, and the surface finish layer covers the conductive post and extends into a space between the conductive post and the bonding pad.

7. The semiconductor substrate structure according to claim 1, wherein the conductive structure further includes a recess portion on the second conductive surface thereof.

8. The semiconductor substrate structure according to claim 1, wherein the conductive structure includes multiple conductive traces, and a pitch between the conductive traces is less than or equal to about 15 µm.

9. The semiconductor substrate structure according to claim 1, wherein the conductive structure includes at least one bonding pad and at least one ball pad, and the conductive trace connects the bonding pad and the ball pad.

10. The semiconductor substrate structure according to claim 1, wherein the dielectric opening has a third width at the second conductive surface, and the third width is greater than the second width.

11. A semiconductor package, comprising:
a semiconductor substrate structure, comprising:
a conductive structure having a first conductive surface and a second conductive surface opposite to the first conductive surface; and
a dielectric structure covering at least a portion of the conductive structure, and having a first dielectric surface and a second dielectric surface opposite to the first dielectric surface, wherein the first conductive surface does not protrude from the first dielectric surface, the second conductive surface is recessed from the second dielectric surface, wherein the dielectric structure includes, or is formed from, a cured photo-sensitive resin, and the dielectric structure defines a dielectric opening in the second dielectric surface to expose a portion of the second conductive surface, wherein a side wall defining the dielectric opening is curved, the dielectric opening has a first width at the second dielectric surface and a second width at a middle portion of the dielectric opening, the first width is greater than the second width, and an entirety of the side wall of the dielectric opening in cross-section has a continuous curvature;
a semiconductor die electrically connected to the first conductive surface; and
an encapsulant covering the semiconductor die and a portion of the semiconductor substrate structure.

12. The semiconductor package according to claim 11, wherein the first conductive surface is recessed from the first dielectric surface.

13. The semiconductor package according to claim 11, wherein a thickness of the semiconductor substrate structure is in a range from about 20 µm to about 60 µm.

14. The semiconductor package according to claim 11, wherein the conductive structure further has a ball pad and a first metal bump disposed on a first surface of the ball pad, and the dielectric opening exposes a portion of a second surface of the ball pad.

15. The semiconductor package according to claim 11, wherein the conductive structure further has a bonding pad and a conductive post disposed on a first surface of the bonding pad.

16. The semiconductor package according to claim 15, wherein the conductive structure further has a seed layer and a surface finish layer, a portion of the seed layer is disposed between the conductive post and the bonding pad, a width of the seed layer portion is less than a width of the conductive post, and the surface finish layer covers the conductive post and extends into a space between the conductive post and the bonding pad.

17. The semiconductor package according to claim 11, wherein the conductive structure further includes a recess portion on the second conductive surface thereof.

18. A semiconductor substrate structure, comprising:
a patterned conductive layer having a first conductive surface and a second conductive surface opposite to the first conductive surface, wherein the patterned conductive layer includes at least one conductive trace; and
a dielectric layer covering at least a portion of the patterned conductive layer, and having a first dielectric surface and a second dielectric surface opposite to the first dielectric surface, wherein the first conductive surface does not protrude from the first dielectric surface, the second conductive surface is recessed from the second dielectric surface, wherein the dielectric layer is a homogeneous dielectric layer that includes, or is formed from, a cured photo-sensitive resin, the dielectric layer defines a dielectric opening in the second dielectric surface to expose a portion of the second conductive surface, an entirety of a side wall of the dielectric opening in cross-section has a continuous curvature, the dielectric opening has a first width at the second dielectric surface, a second width at a middle portion of the dielectric opening, and a third width at the second conductive surface, the first width is greater than the second width, and the third width is greater than the second width.

19. The semiconductor substrate structure according to claim 18, wherein a ratio of the first width to the second width is at least about 1.1.

20. The semiconductor substrate structure according to claim 18, wherein the first conductive surface is substantially coplanar with the first dielectric surface.

* * * * *